United States Patent
Kimura et al.

(10) Patent No.: US 8,740,353 B2
(45) Date of Patent: Jun. 3, 2014

(54) LIQUID EJECTION HEAD AND FLEXIBLE WIRING SUBSTRATE USED IN LIQUID EJECTION HEAD

(75) Inventors: Satoshi Kimura, Kawasaki (JP); Satoshi Oikawa, Yokohama (JP); Kenji Kitabatake, Kawasaki (JP); Yukuo Yamaguchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 194 days.

(21) Appl. No.: 13/284,626

(22) Filed: Oct. 28, 2011

(65) Prior Publication Data

US 2012/0113192 A1 May 10, 2012

(30) Foreign Application Priority Data

Nov. 9, 2010 (JP) .................................. 2010-251157

(51) Int. Cl.
*B41J 2/14* (2006.01)
*B41J 2/05* (2006.01)

(52) U.S. Cl.
USPC ............................................. 347/50; 347/58

(58) Field of Classification Search
None
See application file for complete search history.

(56) References Cited

U.S. PATENT DOCUMENTS

2002/0089567 A1\* 7/2002 Sato et al. ...................... 347/50
2010/0045744 A1   2/2010 Iketani et al.

FOREIGN PATENT DOCUMENTS

| JP | 06-326426 A | 11/1994 | |
| JP | 2003-273476 | \* 9/2003 | ............... H05K 1/02 |
| JP | 2004-276487 A | 10/2004 | |
| JP | 2005-059339 A | 3/2005 | |
| JP | 2009-234087 A | 10/2009 | |
| JP | 2009-241438 A | 10/2009 | |

\* cited by examiner

*Primary Examiner* — Geoffrey Mruk
(74) *Attorney, Agent, or Firm* — Canon USA Inc IP Division (57) ABSTRACT

A flexible wiring substrate that is used in a liquid ejection head having an element substrate provided with energy generating elements for generating energy for ejecting liquid includes: a bending portion; a base member including resin; electrical wiring lines formed on the base member and electrically connected to the element substrate, the electrical wiring lines extending over a ridge of the bending portion; and a metal layer that is arranged on an area of the base member in which no electrical wiring lines are provided and that is not electrically connected to the element substrate, the metal layer extending over the ridge.

9 Claims, 8 Drawing Sheets

LIQUID EJECTION HEAD AND FLEXIBLE WIRING SUBSTRATE USED IN LIQUID EJECTION HEAD

BACKGROUND OF THE INVENTION

1. Field of the Invention

The present invention relates to a liquid ejection head for ejecting liquid and a flexible wiring substrate used in the liquid ejection head.

2. Description of the Related Art

The configuration of an inkjet recording head, which is a typical liquid ejection head that ejects liquid, disclosed in U.S. Patent Application Publication No. 2010/0045744, is known.

In the inkjet recording head disclosed in U.S. Patent Application Publication No. 2010/0045744, a flexible wiring substrate is connected to a recording-element substrate, and electric signals and power for ejecting ink are supplied to the recording-element substrate via the flexible wiring substrate. Furthermore, an electrical contact substrate that receives electric signals from an external device is connected to an end of the flexible wiring substrate. Because the recording-element substrate and the electrical contact substrate are joined to different surfaces of the ink supply unit, as shown in FIG. 1 of U.S. Patent Application Publication No. 2010/0045744, the flexible wiring substrate (i.e., a wiring tape 16 in FIG. 2 of U.S. Patent Application Publication No. 2010/0045744) connecting the recording-element substrate and the electrical contact substrate has a bent portion.

Wiring lines, which are provided on the flexible wiring substrate disclosed in U.S. Patent Application Publication No. 2010/0045744 and electrically connect the recording-element substrate and the electrical contact substrate, are provided over the entire bent portion so as to extend over the ridge of the bent portion. Because the flexible wiring substrate includes a resin film, the bent portion tends to return to the original shape due to the reaction force of the film. In the area in which the wiring lines are provided over the bent portion of the flexible wiring substrate, it is easy to maintain the flexible wiring substrate in a bent state because of the plastic deformation of the wiring lines.

However, in some configurations, there is an area in which portions provided with no wiring lines are continuous at a bent portion of a flexible wiring substrate. In such a case, it is difficult to maintain the flexible wiring substrate in a bent state in the area of the bent portion in which no wiring lines are provided because of the reaction force of the film. Thus, the radius of curvature of the bent portion increases, and the bent portion may project outward from the ink supply unit. Furthermore, when the flexible wiring substrate is bonded to the body of the inkjet recording head, in an area in which portions provided with no wiring line are continuous, a reaction force that causes the bent portion to return to the original state from the bent state is large. Thus, the flexible wiring substrate may be separated and loosened from the inkjet recording head due to this reaction force. As a result, when the inkjet recording head is scanned, the flexible wiring substrate may touch components in the inkjet recording apparatus or a recording sheet, damaging them.

SUMMARY OF THE INVENTION

The present invention can reduce a risk of the bent portion of the flexible wiring substrate, which is used in the liquid ejection head, projecting outward and a risk of the bonded portion becoming loose.

A flexible wiring substrate that is used in a liquid ejection head having an element substrate provided with energy generating elements for generating energy for ejecting liquid includes: a bending portion; a base member including resin; electrical wiring lines formed on the base member and electrically connected to the element substrate, the electrical wiring lines extending over a ridge of the bending portion; and a metal layer that is arranged on an area of the base member in which no electrical wiring lines are provided and that is not electrically connected to the element substrate, the metal layer extending over the ridge.

The present invention utilizes the plastic deformation of the metal layer extending over the ridge of the bending portion of the flexible wiring substrate to reduce the reaction force that causes the flexible wiring substrate to return to the original state from the bent state. Thus, the bent state can be maintained.

The present invention can reduce a risk of the bending portion of the flexible wiring substrate, which is used in the liquid ejection head, projecting outward and a risk of the bonded portion becoming loose. Thus, it is possible to provide a highly reliable flexible wiring substrate and a liquid ejection head using this flexible wiring substrate.

Further features of the present invention will become apparent from the following description of exemplary embodiments with reference to the attached drawings.

DESCRIPTION OF THE EMBODIMENTS

Liquid Ejection Head

Figure 1:
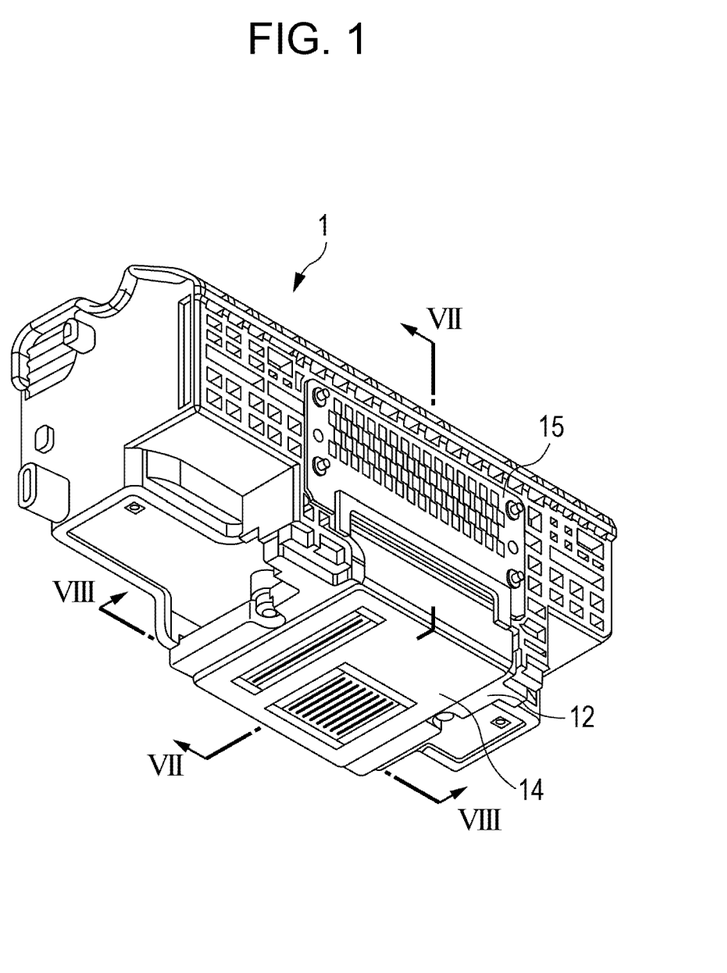
FIG. 1 is a perspective view of an inkjet recording head of the present invention.
Figure 2:
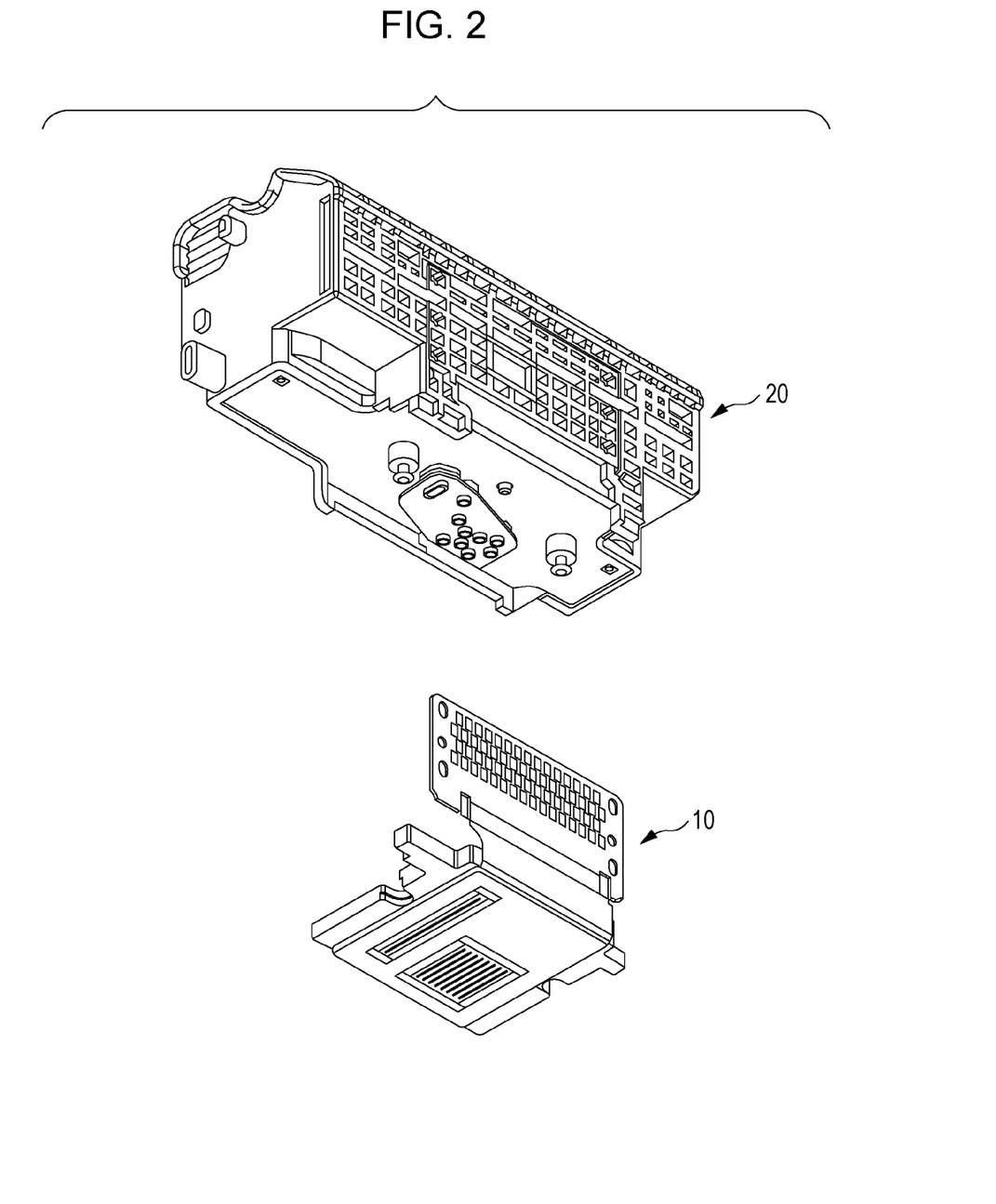
FIG. 2 is an exploded perspective view of the inkjet recording head in FIG. 1.
Figure 3:
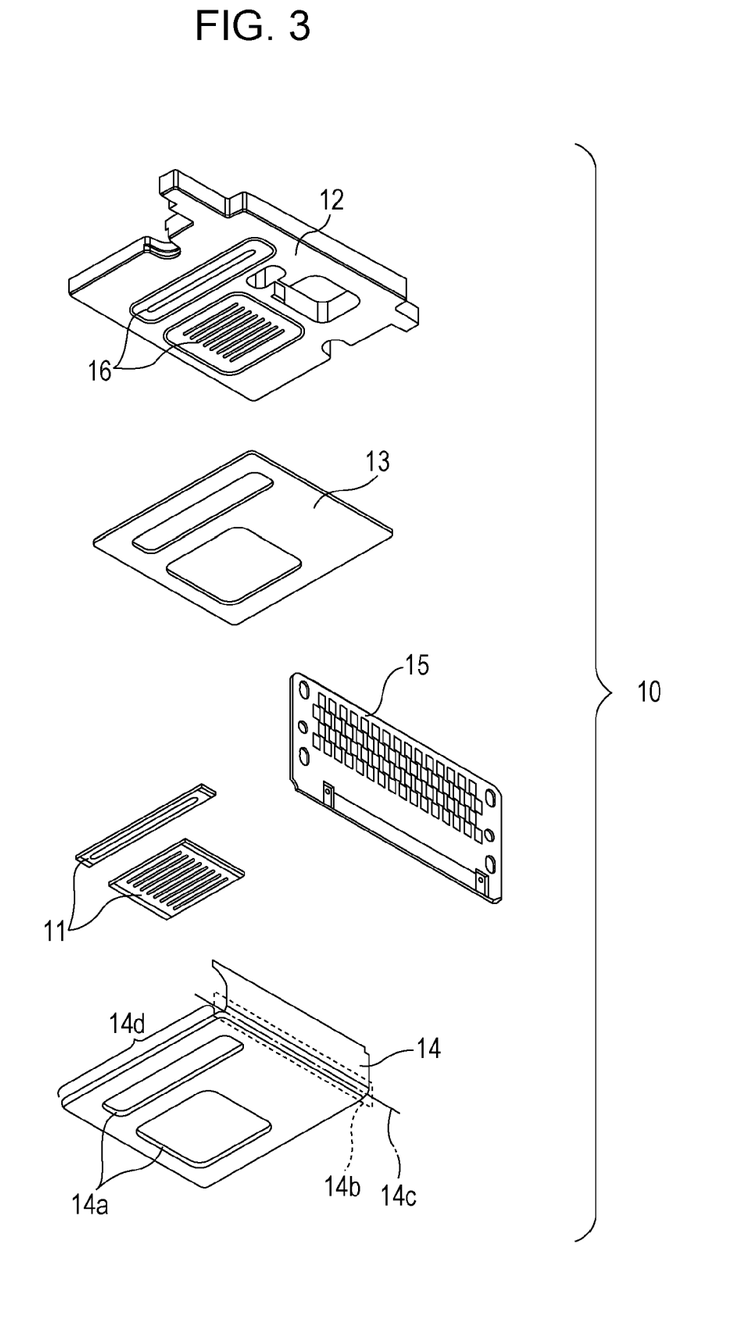
FIG. 3 is an exploded perspective view of a recording element unit.

FIGS. 1 to 3 are diagrams of an inkjet recording head 1 according to an embodiment of the present invention. FIG. 1 is a perspective view of an inkjet recording head 1, FIG. 2 is an exploded perspective view of the inkjet recording head 1, and FIG. 3 is an exploded perspective view of a recording element unit 10 shown in FIG. 2. Referring to FIGS. 1 to 3, the inkjet recording head 1 will be described.

The inkjet recording head 1 shown in FIG. 1 includes the recording element unit 10 and an ink supply unit 20, as shown in FIG. 2. The recording element unit 10 includes two recording-element substrates 11, a first plate 12, a second plate 13, a flexible wiring substrate 14, and an electrical contact substrate 15, as shown in FIG. 3. The ink supply unit 20 supplies ink to the recording element unit 10.

The recording-element substrates 11 include, for example, a silicon substrate and an ejection port plate. A plurality of recording elements (not shown), serving as energy generating elements that generate energy for ejecting ink, are provided on the silicon substrate, and wiring lines made of, for example, aluminum (Al) that supply power to the respective recording elements are formed by deposition. Flow paths and ejection ports, through which ink is ejected, are formed in the ejection port plate so as to correspond to the plurality of recording elements, by using photolithography. The silicon substrate has a plurality of supply ports (not shown) for supplying ink to the ejection ports, the supply ports communicating with the ejection ports through the flow paths.

The two recording-element substrates 11 are precisely positioned with respect to the first plate 12 and securely bonded thereto such that the supply ports in the recording-element substrates 11 communicate with a plurality of supply ports 16 provided in the first plate 12. The first plate 12 is made of, for example, aluminum oxide. The number of the recording-element substrates 11 is not limited to two, as described in this embodiment, and the number, size, etc., of the recording-element substrates 11 may be appropriately selected according to use.

The second plate 13 is made of, for example, ceramic, and the flexible wiring substrate 14 is bonded thereto. The second plate 13 is bonded to the first plate 12. Thus, the second plate 13 can be electrically connected to the flexible wiring substrate 14 and the recording-element substrates 11 on the same plane because their heights are uniform.

The flexible wiring substrate 14 forms electric signal paths through which electric signals for ejecting ink are applied to the recording-element substrates 11. The flexible wiring substrate 14 has openings 14a at positions corresponding to the recording-element substrates 11. Inner leads projecting inward from the openings 14a are electrically connected to electrical connecting portions of the recording-element substrates 11 fitted to the openings 14a. The electrical contact substrate 15, which is a rigid substrate having external signal input terminals for receiving electric signals from the inkjet recording apparatus, is electrically connected to an end of the flexible wiring substrate 14. Although the wiring line substrate according to this embodiment is composed of separate wiring line substrates, namely, the flexible wiring substrate 14 and the electrical contact substrate 15, a configuration in which external signal input terminals are provided on the flexible wiring substrate 14 is also possible.

First Embodiment

Figure 4A:
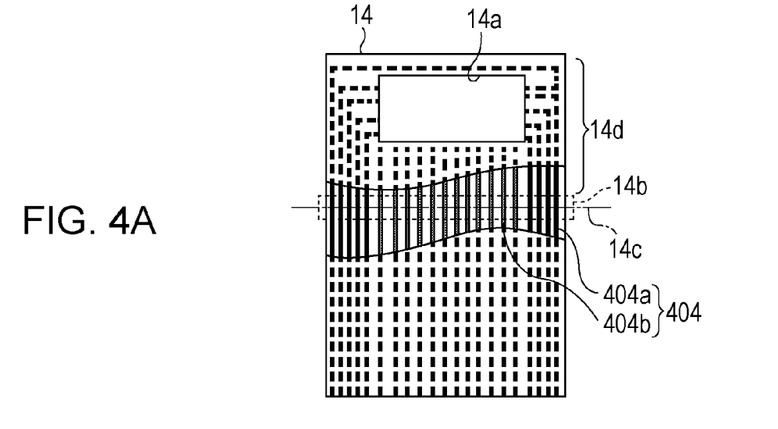
FIGS. 4A to 4C are plan views of a flexible wiring substrate according to a first embodiment of the present invention.
Figure 4B:
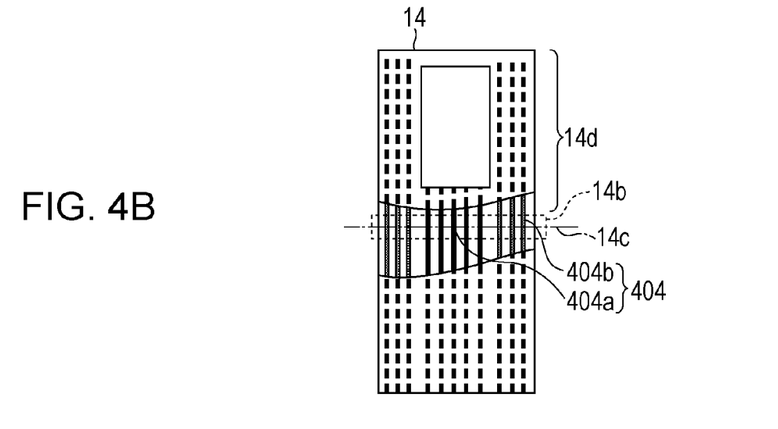
Figure 4C:
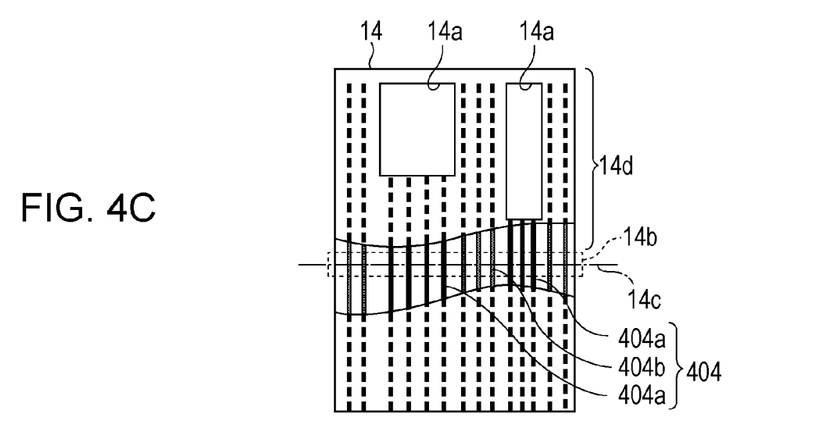

Next, the flexible wiring substrate 14 according to a first embodiment of the present invention will be described. FIGS. 4A to 4C are plan views of the flexible wiring substrate 14 according to the first embodiment. Wiring lines arranged in the flexible wiring substrate 14 are indicated by dashed lines. In FIGS. 4A to 4C, part of the wiring lines located beneath a tape-like base member 401 of the flexible wiring substrate 14 are indicated by solid lines to show the positional relationship between real wiring lines and dummy wiring lines (described below).

Figure 8:
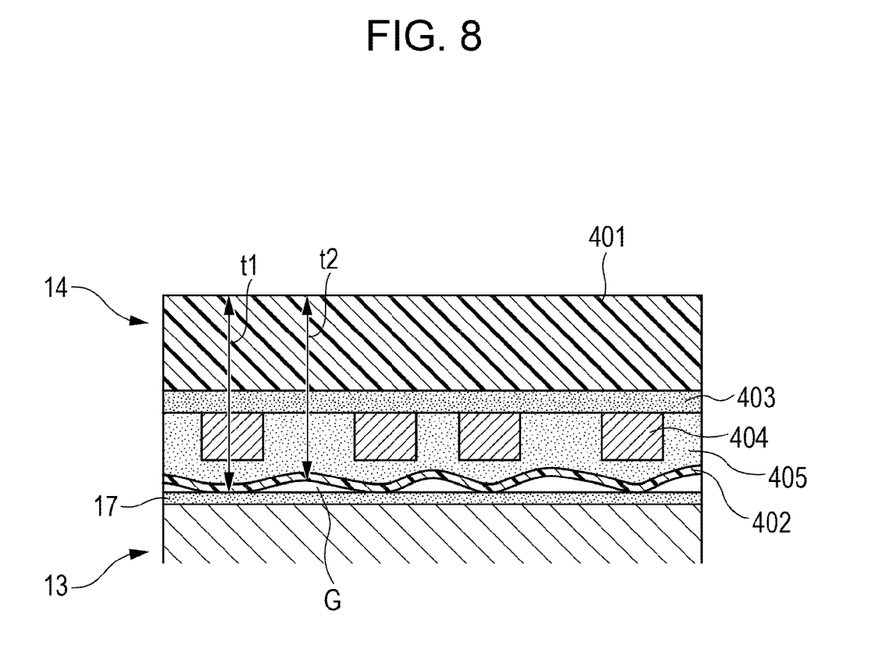
FIG. 8 is a sectional view of the layer structure of the flexible wiring substrate.

FIG. 8 is a sectional view of a part of the flexible wiring substrate 14 and the second plate 13, taken along line VIII-VIII in FIG. 1. Referring to FIG. 8, the configuration of the flexible wiring substrate 14 will be described in detail. The flexible wiring substrate 14 according to this embodiment is composed of, for example, a tape automated bonding (TAB) tape, in which wiring lines 404 composed of copper foil is disposed on the insulating tape-like base member 401. The wiring lines 404 are bonded to the tape-like base member 401 by a first adhesive 403, and a cover film 402 is bonded thereto by a second adhesive 405. The flexible wiring substrate 14 is bonded, at the cover film 402 side, to the second plate 13 by an adhesive 17. The tape-like base member 401 and the cover film 402 are including resin, and, for example, the tape-like base member 401 is composed of a polyimide resin, and the cover film 402 is composed of an aramid resin. The material and configuration of the flexible wiring substrate 14 are not specifically limited to those mentioned above.

The flexible wiring substrate 14 on the second plate 13 is bent toward one side surface of the first plate 12, and the electrical contact substrate 15 connected to the end of the flexible wiring substrate 14 is fixed to one surface of the ink supply unit 20 (see FIG. 1). That is, the flexible wiring substrate 14 is bent along a lower surface 13a (first surface) of the second plate 13 and one surface 20a (second surface) of the ink supply unit 20 (see FIG. 7A). A bonding portion 14d on the second plate 13 is bonded to the surface 13a of the second plate 13 (see FIG. 3). A bending portion 14b of the flexible wiring substrate 14 is encircled by a dashed line in FIG. 3. A ridge 14c of the bending portion 14b is indicated by a one-dot straight chain line in FIG. 3. The bonding portion 14d to be bonded to the second plate 13 is provided adjacent to the bending portion 14b.

When the flexible wiring substrate 14 is bent, first, the flexible wiring substrate 14 is bent such that the radius of curvature of the bending portion 14b is smaller than the intended radius of curvature, and then, the flexible wiring substrate 14 is bent again to adjust the radius of curvature. By bending the flexible wiring substrate 14 once to plastically deform the wiring lines 404, the bending tendency is given to the bending portion 14b of the flexible wiring substrate 14. Thus, a risk of the bending portion 14b projecting outward is reduced.

Figure 7A:
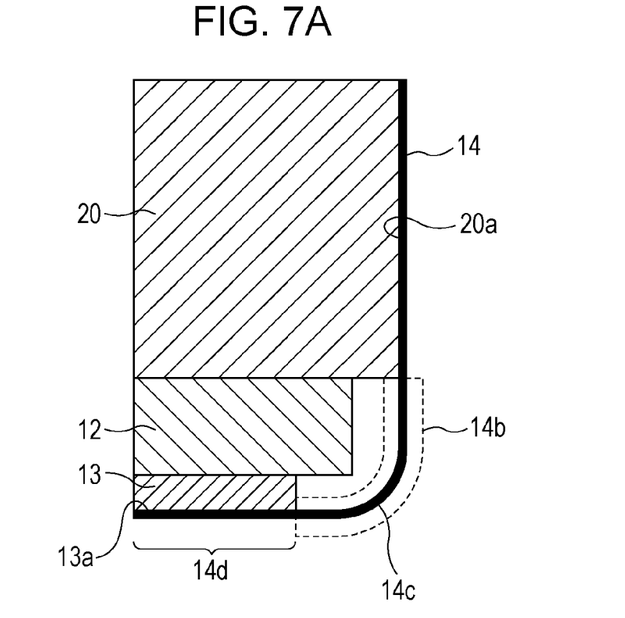
FIG. 7A is a sectional view of a bending portion of the flexible wiring substrate of the inkjet recording head of the present invention, and 7B is a sectional view of a bending portion of the flexible wiring substrate of an inkjet recording head according to Comparative Example.
Figure 7B:
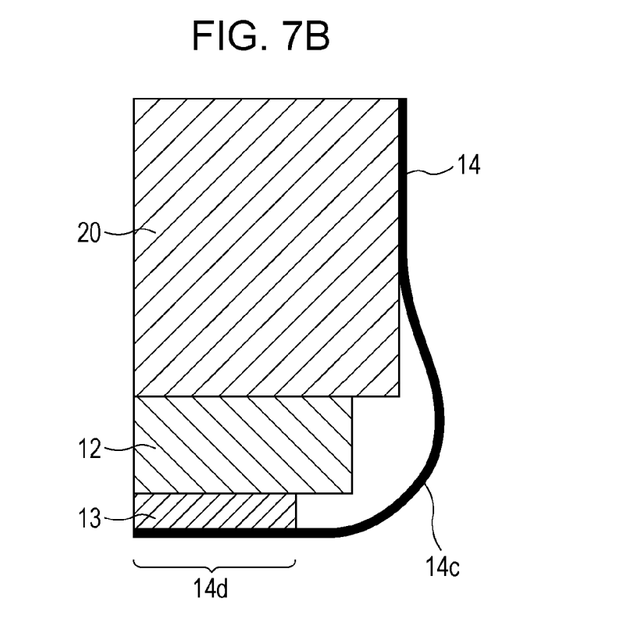

FIGS. 7A and 7B are sectional views of a part of the inkjet recording head 1 including the bending portion 14b of the flexible wiring substrate 14, taken along line VII-VII in FIG. 1. FIG. 7A is a sectional view of a part including the bending portion 14b in the area in which electrical wiring lines 404a according to this embodiment (hereinbelow, "real wiring lines") are provided. FIG. 7B is a sectional view of a part including the bending portion 14b in the area in which no real wiring lines 404a are provided, in a flexible wiring substrate according to Comparative Example. The real wiring lines 404a are the wiring lines 404 that are provided on the flexible wiring substrate and electrically connect the recording-element substrate and the electrical contact substrate. An area of the flexible wiring substrate in which no real wiring lines 404a are provided is an area in which portions provided with no real wiring lines 404a are continuous. Thus, the density of the real wiring lines 404a in this area is 0. Accordingly, the density of the real wiring lines 404a in the area in which no real wiring lines 404a are provided is smaller than that in the area in which the real wiring lines 404a are provided.

As shown in FIG. 7B, in the area in which no real wiring lines 404a are provided, the bending portion 14b of the flexible wiring substrate 14 may project outward due to the reaction forces of the tape-like base member and cover film. Furthermore, there is a risk of the bonding portion 14d of the flexible wiring substrate 14 being separated and loosened from the surface 13a of the second plate 13.

To overcome this problem, in this embodiment, as shown in FIG. 4A, dummy wiring lines 404b serving as a metal layer composed of copper foil or the like are provided in the area of the bending portion 14b of the flexible wiring substrate 14 where no real wiring lines 404a, which are electrically connected to the recording elements of the recording-element substrates 11, are provided. That is, the dummy wiring lines 404b are provided so as to extend over the ridge 14c of the bending portion 14b. The dummy wiring lines 404b are the metal layer that is not electrically connected to the recording elements.

In this configuration, it is easy to maintain the bending portion 14b in a bent state, by utilizing the plastic deformation of the dummy wiring lines 404b. Accordingly, it is possible to reduce a risk of the bending portion 14b of the flexible wiring substrate 14 projecting outward and a risk of the flexible wiring substrate 14 being separated from the second plate 13. Thus, it is possible to reduce a risk of the flexible wiring substrate 14 touching and damaging the components inside the inkjet recording apparatus. Furthermore, if the flexible wiring substrate 14 is damaged, ink may enter from the damaged part and may deposit on the electrically connected portions of the recording-element substrates 11 and the flexible wiring substrate 14. With the configuration according to this embodiment, because a risk of damaging the flexible wiring substrate 14 can be reduced, a risk of ink entering from the damaged part can be reduced. Furthermore, it is easy to give the bending tendency to the flexible wiring substrate 14 when the flexible wiring substrate 14 is bent to form the bending portion 14b during fabrication of the inkjet recording head 1. Thus, the fabrication of the inkjet recording head 1 is simplified.

In the configuration in FIG. 4A, the dummy wiring lines 404b are provided in the middle portion of the flexible wiring substrate 14 in the direction in which the wiring lines 404 are provided, and the real wiring lines 404a are provided on both sides of the area in which the dummy wiring lines 404b are provided. However, the positions of the real wiring lines 404a and dummy wiring lines 404b are not limited thereto, and, as shown in FIG. 4B, a configuration in which the dummy wiring lines 404b are provided on both sides the real wiring lines 404a, which are provided in the middle portion of the flexible wiring substrate 14, is also possible.

FIG. 4C is a plan view of the flexible wiring substrate 14 having the openings 14a at positions corresponding to the two recording-element substrates 11 shown in FIG. 3.

In this embodiment, as shown in FIGS. 4A to 4C, which are the plan views of the flexible wiring substrate 14, the real wiring lines 404a and the dummy wiring lines 404b are provided perpendicular to the ridge 14c of the bending portion 14b at the bending portion 14b. Although it is possible to give the bending tendency to the flexible wiring substrate 14 as long as the dummy wiring lines 404b are provided so as to extend over the ridge 14c of the bending portion 14b, this configuration, in which the wiring lines are provided perpendicular to the ridge, is more desirable because the bending tendency can be given more reliably.

Although the plurality of dummy wiring lines 404b are provided in this embodiment, a configuration in which one dummy wiring line having such a large area that it covers the entirety of the area in which no real wiring lines are provided is also possible.

It is desirable that, at the bending portion 14b, the density of the real wiring lines 404a in the area in which the real wiring lines 404a are provided be substantially equal to the density of the dummy wiring lines 404b in the area in which the dummy wiring lines 404b are provided. With this configuration, the thickness of the area in which the real wiring lines 404a are provided and the thickness of the area in which the dummy wiring lines 404b are provided, at the bending portion 14b of the flexible wiring substrate 14, are substantially uniform. Thus, the flexible wiring substrate 14 can be bent uniformly at the bending portion 14b.

Also at the bonding portion 14d, it is desirable that the density of the real wiring lines 404a in the area in which the real wiring lines 404a are provided be substantially equal to the density of the dummy wiring lines 404b in the area in which the dummy wiring lines 404b are provided. With this configuration, the thickness of the bonding portion 14d of the flexible wiring substrate 14 is substantially uniform. Thus, the flexible wiring substrate 14 and the second plate 13 can be securely bonded to each other. When the density of the real wiring lines 404a is not uniform in the area in which the real wiring lines 404a are provided, it is desirable that the density of the dummy wiring lines 404b be equal to or higher than the density of the real wiring lines 404a in the area where their density is lowest in the area in which the real wiring lines 404a are provided. This configuration makes the density of the real wiring lines 404a and the density of the dummy wiring lines 404b equal as much as possible at the bending portion 14b and the bonding portion 14d, thereby making the thickness of the flexible wiring substrate 14 substantially uniform.

Second Embodiment

Figure 5:
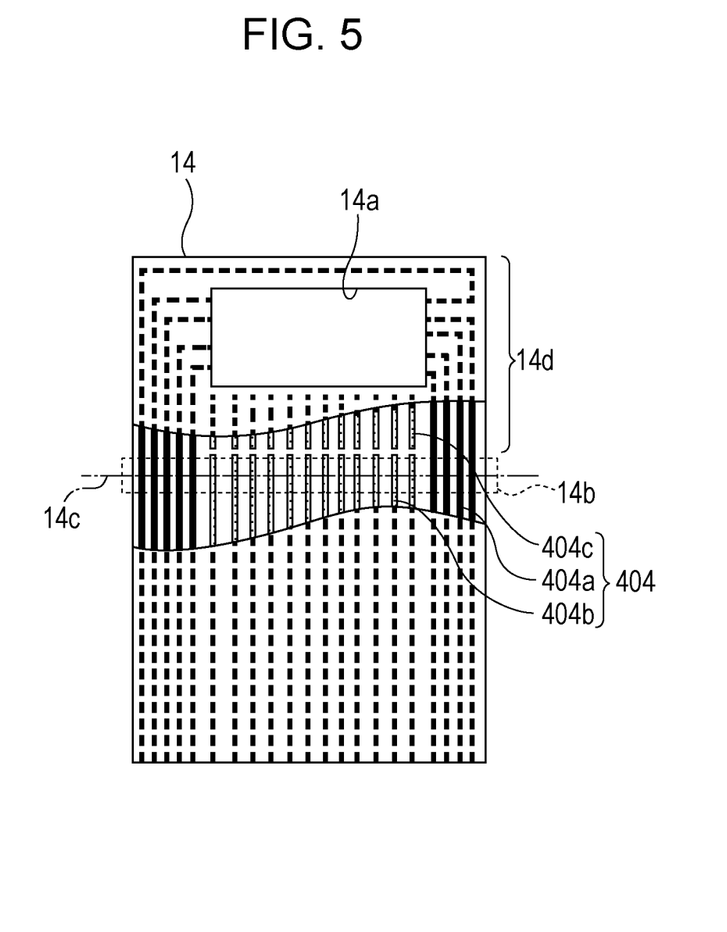
FIG. 5 is a plan view of a flexible wiring substrate according to a second embodiment of the present invention.

FIG. 5 is a plan view of the flexible wiring substrate 14 according to a second embodiment of the present invention. The wiring lines provided in the flexible wiring substrate 14 are indicated by dashed lines. In FIG. 5, part of the wiring lines located beneath the tape-like base member 401 of the flexible wiring substrate 14 are indicated by solid lines to show the positional relationship between the real wiring lines and the dummy wiring lines.

Also in this embodiment, similarly to the first embodiment, at the bending portion 14b of the flexible wiring substrate 14, the dummy wiring lines 404b are provided in the area in which the real wiring lines 404a, which are electrically connected to the recording elements of the recording-element substrates 11, are not provided. This configuration makes it easy to maintain the bending portion 14b of the flexible wiring substrate 14 in a bent state and makes it possible to reduce a risk of the bending portion projecting outward and a risk of the bonded portion becoming loose.

Furthermore, in this embodiment, at the bonding portion 14d of the flexible wiring substrate 14 bonded to the second plate 13, other dummy wiring lines 404c (another metal layer) that are not continuous with the dummy wiring lines 404b extending over the ridge 14c of the bending portion 14b are provided.

Although the flexible wiring substrate 14 is maintained in a bent state due to the plastic deformation of the wiring lines 404 formed at the bending portion 14b, there is still a reaction force that causes the tape-like base member 401 and the cover film to return to the original state from the bent state. In this embodiment, the dummy wiring lines 404b are not continuous with the dummy wiring lines 404c provided in the bonding portion 14d. Because the dummy wiring lines 404b are terminated near the bending portion 14b, even if a portion of the bonding portion 14d near the bending portion 14b is separated from the second plate 13 due to the reaction force of the tape-like base member 401 and the like, the reaction force is less likely to be transmitted across the entirety of the bonding portion 14d. If the dummy wiring lines 404b extend over the bending portion 14b and the bonding portion 14d and are continuous without being terminated near the bending portion 14b (as in the first embodiment), if separation is generated locally, the separation may spread across the entire bonding portion 14d, due to the rigidity of the dummy wiring lines 404b. According to this embodiment, even if separation is generated locally, the separation can be stopped near the bending portion 14b. Thus, it is possible to further reduce a risk of the entirety of the bonding portion 14d being separated from the second plate 13.

Furthermore, from the standpoint of preventing separation of the flexible wiring substrate 14, a configuration in which the dummy wiring lines 404b are terminated near the bending portion 14b and in which the dummy wiring lines 404c are not provided, that is, a configuration in which only the dummy wiring lines 404b are provided near the bending portion 14b, may be employed. As in this embodiment, by providing the dummy wiring lines 404c at the bonding portion 14d, the thickness of the bonding portion 14d of the flexible wiring substrate 14 can be made substantially uniform. Because this configuration enables the flexible wiring substrate 14 and the second plate 13 to be securely bonded to each other, the configuration of this embodiment is more desirable.

Furthermore, in this embodiment, part of the dummy wiring lines 404b extend over the bonding portion to be bonded to the second plate 13. With this configuration, in which the dummy wiring lines 404b are terminated in the bonding portion 14d, at a position near the bending portion 14b, and in which the bent dummy wiring lines 404b extend over the bending portion 14b and the bonding portion 14d, it becomes easier to maintain the flexible wiring substrate 14 in a bent state.

Furthermore, it is desirable that the distance between the terminated ends of the dummy wiring lines, that is, the distance between the ends of the dummy wiring lines 404b and the ends of the dummy wiring lines 404c, be substantially equal to the distance between the wiring lines 404 in the direction in which the wiring lines 404 are provided, so that the thickness of the flexible wiring substrate 14 is uniform as much as possible.

In the flexible wiring substrate 14, the dummy wiring lines have greater positioning flexibility than the real wiring lines 404a. Thus, as in this embodiment, the other dummy wiring lines 404c not continuous with the dummy wiring lines extending over the bending portion 14b can be provided.

Although the dummy wiring lines 404c are provided in the direction intersecting the ridge 14c of the bending portion 14b in FIG. 5, the direction is not specifically limited.

Third Embodiment

Figure 6:
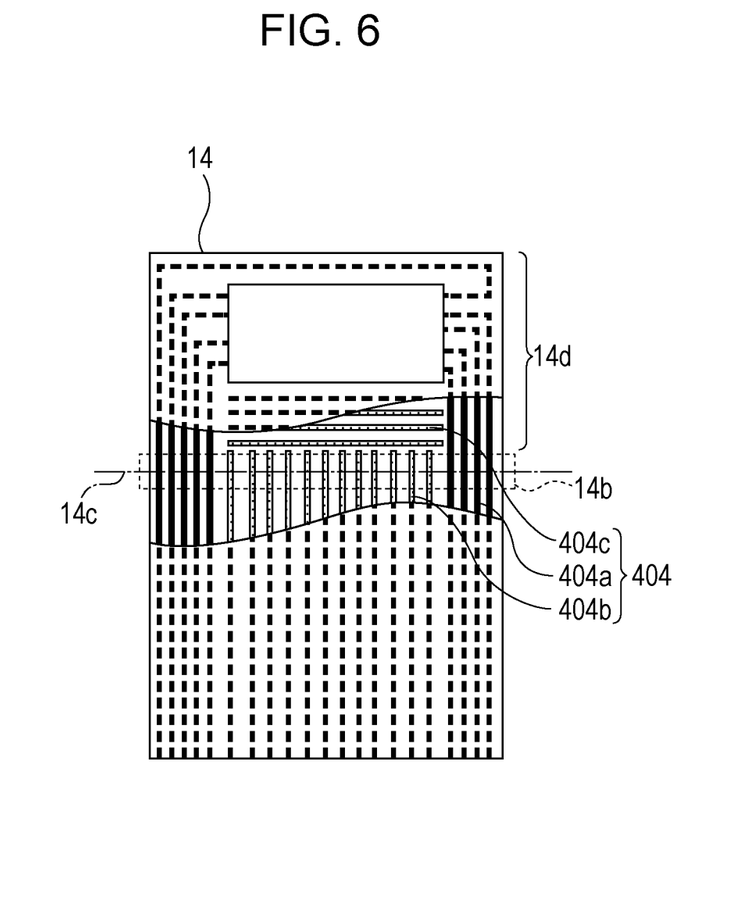
FIG. 6 is a plan view of a flexible wiring substrate according to a third embodiment of the present invention.

FIG. 6 is a plan view of the flexible wiring substrate 14 according to a third embodiment of the present invention, in which the wiring lines provided in the flexible wiring substrate 14 are indicated by dashed lines. In FIG. 6, part of the wiring lines located beneath the tape-like base member 401 of the flexible wiring substrate 14 are indicated by solid lines to show the positional relationship between the real wiring lines and the dummy wiring lines.

Also in this embodiment, similarly to the above-described embodiments, at the bending portion 14b of the flexible wiring substrate 14, the dummy wiring lines 404b are provided in the area in which the real wiring lines 404a, which are electrically connected to the recording elements of the recording-element substrates 11, are not provided. This configuration makes it easy to maintain the bending portion 14b of the flexible wiring substrate 14 in a bent state and makes it possible to reduce a risk of the bending portion projecting outward and a risk of the bonded portion becoming loose.

Furthermore, similarly to the second embodiment, at the bonding portion 14d of the flexible wiring substrate 14 bonded to the second plate 13, the dummy wiring lines 404c that are not continuous with the dummy wiring lines 404b extending over the ridge 14c of the bending portion 14b are provided. With this configuration, a risk of the flexible wiring substrate 14 separating from the second plate 13 can be reduced.

Furthermore, in this embodiment, the dummy wiring lines 404c provided at the bonding portion 14d of the flexible wiring substrate 14 extend in the direction intersecting the dummy wiring lines 404b.

Now, contact between the flexible wiring substrate 14 and the second plate 13 will be described with reference to FIG. 8. The thickness t1 of the flexible wiring substrate 14, at a portion provided with the wiring lines 404, is larger than the thickness t2 of the flexible wiring substrate 14, at a portion provided with adhesive and no wiring lines 404. In FIG. 8, for the ease of understanding, the difference in thickness is exaggerated.

When the flexible wiring substrate 14 is bonded to the second plate 13, the cover film 402 corresponding to the portions provided with the wiring lines 404 is securely bonded to the second plate 13. However, because the thickness of the flexible wiring substrate 14 is small in the portions provided with no wiring lines 404, gaps G may be generated between the flexible wiring substrate 14 and the second plate 13, due to shortage or shrinkage on curing of the adhesive 17 used to bond the flexible wiring substrate 14 and the second plate 13.

When the dummy wiring lines 404c are provided in a direction intersecting the ridge 14c of the bending portion 14b like the dummy wiring lines 404b, the gaps G between the flexible wiring substrate 14 and the second plate 13 are generated in the direction intersecting the ridge 14c of the bending portion 14b. As described above, the reaction force of the bending portion 14b causes the flexible wiring substrate 14 to be separated from the second plate 13 near the bending portion 14b, and ink may flow in from the separated portion. In this case, because the gaps G are generated in the direction toward the recording-element substrates 11, ink may flow through the gaps G and may deposit on the electrically connected portion between the recording-element substrates 11 and the flexible wiring substrate 14.

In this embodiment, the dummy wiring lines 404c are provided along the ridge 14c of the bending portion 14b. With this configuration, even if gaps are generated between the flexible wiring substrate 14 and the second plate 13, the gaps extend along the ridge 14c of the bending portion 14b. Thus, a risk of ink flowing through the gaps G and moving toward the recording-element substrates 11 can be reduced. Accordingly, even if the flexible wiring substrate 14 is separated from the second plate 13 at a position near the bending portion 14b, a risk of ink flowing through the gaps G and depositing on the electrically connected portion of the recording-element substrates 11 can be reduced.

Although the wiring lines 404 are composed of copper in the above-described embodiments, the material of the wiring lines 404 is not specifically limited thereto, and the wiring lines 404 may be composed of gold or aluminum. Furthermore, the real wiring lines and the dummy wiring lines may be composed of different materials. However, it is desirable that the real wiring lines 404a and the dummy wiring lines 404b be composed of the same material because the dummy wiring lines 404b can be formed at the same time with the real wiring lines, during the fabrication of the flexible wiring substrate 14.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-251157 filed Nov. 9, 2010, which is hereby incorporated by reference herein in its entirety.

What is claimed is:

1. A flexible wiring substrate that is used in a liquid ejection head having an element substrate provided with energy generating elements for generating energy for ejecting liquid, the flexible wiring substrate comprising:
a bending portion;
a base member including resin and having a bonding portion adjacent the bending portion and bonded to a surface on which the element substrate is provided;
electrical wiring lines formed on the base member and electrically connected to the element substrate, the electrical wiring lines extending over a ridge of the bending portion; and
a metal layer that is provided on the base member and that is not electrically connected to the element substrate, the metal layer extending over the ridge; and
another metal layer that is provided on a reverse side of the bonding portion and that is not electrically connected to the element substrate, the other metal layer being not three-dimensionally bent.

2. The flexible wiring substrate according to claim 1, wherein a plurality of the metal layers are provided along the ridge.

3. The flexible wiring substrate according to claim 2, wherein the density of the metal layers on the area in which the metal layers are provided is equal to or greater than the density of the electrical wiring lines on the area, where the density thereof is least in value on the area in which the electrical wiring lines extending over the ridge are provided.

4. A liquid ejection head comprising:
an element substrate provided with energy generating elements for generating energy for ejecting liquid;
a first surface on which the element substrate is provided;
a second surface; and
a flexible wiring substrate provided on the first surface and the second surface, the flexible wiring substrate including a bending portion bent between the first surface and the second surface,
wherein the flexible wiring substrate includes a base member including resin and having a bonding portion adjacent the bending portion and bonded to the first surface, electrical wiring lines formed on the base member and electrically connected to the element substrate, the electrical wiring lines extending over a ridge of the bending portion, a metal layer that is provided on the base member and that is not electrically connected to the element substrate, the metal layer extending over the ridge, and another metal layer that is provided on a reverse side of the bonding portion and that is not electrically connected to the element substrate, the other metal layer being not three-dimensionally bent.

5. The liquid ejection head according to claim 4, wherein a plurality of the metal layers are provided along the ridge.

6. The liquid ejection head according to claim 5, wherein the density of the metal layers on the area in which the metal layers are provided is equal to or greater than the density of the electrical wiring lines on the area where the density thereof is least in magnitude on the area in which the electrical wiring lines extending over the ridge are provided.

7. The liquid ejection head according to claim 4, wherein the metal layer extends over the bonding portion.

8. The liquid ejection head according to claim 7, wherein a portion of the metal layer extending over the bonding portion is terminated near the bending portion.

9. The liquid ejection head according to claim 4, wherein the other metal layer provided near the element substrate extends along the ridge.

* * * * *